United States Patent [19]
Kwong

[11] Patent Number: 6,118,640
[45] Date of Patent: Sep. 12, 2000

[54] ACTIVELY-DRIVEN THIN-OXIDE MOS TRANSISTOR SHUNT FOR ESD PROTECTION OF MULTIPLE INDEPENDENT SUPPLY BUSSES IN A MIXED-SIGNAL CHIP

[75] Inventor: David Kwong, Fremont, Calif.

[73] Assignee: Pericom Semiconductor Corp., San Jose, Calif.

[21] Appl. No.: 09/251,722

[22] Filed: Feb. 17, 1999

[51] Int. Cl.[7] .................................................. H02H 9/00
[52] U.S. Cl. ............................................................ 361/56
[58] Field of Search ........................... 361/56, 91.1, 91.5, 361/111, 119; 257/355

[56] References Cited

U.S. PATENT DOCUMENTS

| | | | |
|---|---|---|---|
| 5,237,395 | 8/1993 | Lee | 361/56 |
| 5,287,241 | 2/1994 | Puar | 361/56 |
| 5,430,595 | 7/1995 | Wagner et al. | 361/56 |
| 5,442,217 | 8/1995 | Mimoto | 257/361 |
| 5,515,225 | 5/1996 | Gens et al. | 361/56 |
| 5,530,612 | 6/1996 | Maloney | 361/56 |
| 5,616,943 | 4/1997 | Nguyen et al. | 257/355 |
| 5,740,000 | 4/1998 | Stackhouse et al. | 361/56 |
| 5,751,051 | 5/1998 | Hayano | 257/546 |

OTHER PUBLICATIONS

Duvvury and Diaz, "Dynamic Gate Coupling of NMOS for Efficient Output ESD Protection" IRPS/IEEE, 1992, pp. 141–150 No month.

*Primary Examiner*—Ronald W. Leja
*Attorney, Agent, or Firm*—Stuart T. Auvinen

[57] ABSTRACT

An electro-static-discharge (ESD) protection circuit protects internal power supplies in a mixed-signal IC. An active protection circuit is used. The ESD-protection circuit uses standard transistors and is actively enabled and disabled by standard transistors. A standard thin-oxide NMOS transistor is the ESD switch (shunt) between power supply busses. This thin-oxide transistor ESD switch is actively enabled and disabled by a control circuit. NMOS transistors in the control circuit discharge the gate node of the ESD switch when the power supplies are powered up, thus actively disabling the ESD protection circuit. When an ESD pulse is applied to a supply when powered down, a capacitor couples the rapid voltage rise to the gate node. The rising voltage turns on the ESD switch, shunting the ESD pulse to the other supply. A resistor and a p-channel MOS transistor in series then discharge the gate node to the other supply. The capacitor, resistor, and p-channel transistor form an RC network. A second RC network is connected to the other supply so that symmetric protection is provided. Slow and unresponsive thick-oxide transistors and diodes are avoided.

20 Claims, 4 Drawing Sheets

ACTIVELY-DRIVEN THIN-OXIDE MOS TRANSISTOR SHUNT FOR ESD PROTECTION OF MULTIPLE INDEPENDENT SUPPLY BUSSES IN A MIXED-SIGNAL CHIP

FIELD OF THE INVENTION

This invention relates to electro-static-discharge (ESD) protection circuits, and more particularly to actively-controlled ESD protection circuits in mixed-signal devices.

BACKGROUND OF THE INVENTION

Advances in semiconductor processes technology have produced extremely small transistors. These tiny transistors have thin oxide and insulating layers that can easily be damaged by relatively small currents with even a moderate driving force (voltage). Special care is required when a person handles these semiconductor devices.

Static electricity that normally builds up on a person can discharge across the input pins or a semiconductor integrated circuit (IC or chip). IC chips are routinely tested for resistance to such electro-static-discharges (ESD) using automated testers that apply a voltage across different pairs of pins of the chip. Any pair of pins may be chosen for the ESD test.

Some IC's today include both analog and digital subsystems. The digital portion of a chip often produces switching noise that could be coupled to the analog portions of the chip, resulting in loss of analog precision. Such mixed-signal chips typically use separate power supply busses for analog and digital portions. The internal analog power-supply is separated from the internal digital power-supply, even when both power supplies have the same nominal voltage. Separate pins of the chip apply external power-supplies to the internal analog and digital power-supply busses.

Sometimes several different internal power-supply busses are used for different digital or analog blocks. The output drivers may use a supply bus that is isolated from internal analog and digital supply or ground busses. Some circuits may require a different power-supply voltage, such as for analog circuits or programming circuits. Thus many different, isolated power-supply busses may exist on a mixed-signal IC.

Although these separate internal busses reduce noise coupling, ESD protection is hindered. An ESD pulse applied to any 2 pins may not directly connect to the ground or power supply attached to an input-protection device for a pin. For example, an ESD pulse applied to an analog-input pin and to the digital ground does not necessarily activate the ESD protection device for the analog-input pin, since the protection device might be connected to the analog ground rather than to the digital ground.

Various schemes have been proposed to provide ESD protection for mixed-signal chips. Nguyen et al., in U.S. Pat. No. 5,616,943, discloses using thick-oxide transistors and diodes. See also Puar, U.S. Pat. No. 5,287,241, and Stackhouse et al., U.S. Pat. No. 5,740,000.

FIG. 1A shows a simplified prior-art ESD protection device using a thick-oxide transistor. Power-supply A and B are connected by thick-oxide transistor 12, which does not normally conduct so that the supplies are isolated. However, when a high voltage is applied to supply A during an ESD event, thick-oxide transistor 12 conducts, either by the high voltage forming a conducting channel under the thick field-oxide under the gate, or by punch-through in the substrate from drain to source in the substrate.

While such thick-oxide transistors are less sensitive to damage than thin-oxide transistors, the amount of current conducted is reduced. A very high gate voltage is needed to turn on the transistor since the channel is separated from the gate by the larger distance of the thick oxide. Damage to other thin-oxide transistors on the chip can occur before the thick-oxide transistor turns on. Thus the protection provided by thick-oxide transistor 12 is less than desired.

FIG. 1B shows a simplified prior-art ESD protection circuit that uses diodes. Diodes 14 turn on when the voltage on supply A is sufficiently above the voltage on supply B. Diodes can be formed using diffusion regions or well regions in the semiconductor substrate. These substrate diodes may cause unwanted latch-up when triggered. When diodes 14 are Zener diodes, additional processing steps may be needed, increasing the cost of the chip. When supplies A and B have different nominal voltages, diode chains may not be effective or may require many diodes in series.

Such diodes and thick-oxide transistors are passively controlled, being activated by high voltages during an ESD pulse. The diodes in particular may turn on when the chip is being powered up since they are not actively disabled during normal operation. Such passively-controlled protection devices do not take advantage of active-transistor technology.

What is desired is an ESD-protection circuit that protects internal power supplies in a mixed-signal IC. An active rather than a passive protection circuit is desired. It is desired to actively enable or disable the ESD-protection circuit. It is desired to actively enable and disable a thin-oxide transistor as an ESD shunt between power supply busses. It is desired to avoid thick-oxide transistors and diodes.

SUMMARY OF THE INVENTION

An electro-static-discharge (ESD) protection circuit has a first power-supply input for coupling to a first power supply and a second power-supply input for coupling to a second power supply. The first power supply is not directly connected to the second power supply by metal lines on an integrated circuit containing the ESD protection circuit.

An ESD switch is coupled to conduct current between the first power-supply input and the second power-supply input. The ESD switch is controlled by a gate node.

An active control circuit is coupled to the first power-supply input and the second power-supply input. It drives an enable voltage onto the gate node to enable the ESD switch and a disable voltage onto the gate node to disable the ESD switch. The disable voltage is driven to the gate node when the first or second power-supply inputs are not powered up.

A first filter network is coupled to the first power-supply input. It couples a rapid voltage rise from an ESD pulse applied to the first power-supply input to the gate node to generate the enable voltage on the gate node. The enable voltage causes the ESD switch to conduct the ESD pulse to the second power-supply input when the enable voltage is applied. A first discharge path, in the first filter network, is coupled between the gate node and the second power-supply input. It gradually discharges the enable voltage to the second power-supply input through a first resistor. Thus the ESD switch is actively disabled and enabled.

In further aspects of the invention, the ESD switch has a standard n-channel transistor with substantially a same thickness of gate oxide as most other n-channel transistors on the integrated circuit. Thus a standard thin-oxide n-channel transistor shunts the ESD pulse between the first and second power-supply inputs.

In still further aspects the active control circuit further has a first disable transistor with a gate coupled to the first power-supply input. It discharges the gate node to a ground when the first power supply is powered up. A second disable transistor has a gate coupled to the second power-supply input. It discharges the gate node to the ground when the second power supply is powered up. Thus the disable voltage is driven to the gate node by the first and second disable transistors.

In further aspects a second filter network is coupled to the second power-supply input. It couples a rapid voltage rise from an ESD pulse applied to the second power-supply input to the gate node to generate the enable voltage on the gate node. The enable voltage causes the ESD switch to conduct the ESD pulse to the first power-supply input when the enable voltage is applied. A second discharge path, in the second filter network, is coupled between the gate node and the first power-supply input. It gradually discharges the enable voltage to the first power-supply input through a second resistor. Thus the first and second filter networks provide symmetric protection for both the first and second power-supply inputs.

In other aspects the first filter network includes a first capacitor between the first power-supply input and the gate node for capacitivly coupling the rapid voltage rise from an ESD pulse to the gate node. The second filter network includes a second capacitor between the second power-supply input and the gate node for capacitivly coupling the rapid voltage rise from an ESD pulse to the gate node.

The first capacitor and the second capacitor also provide bypass capacitate filtering between the first power supply and the second power supply when powered up wherein power-supply noise is reduced.

In further aspects of the invention, the first discharge path includes a first resistor and a first filter transistor in series. The second discharge path includes a second resistor and a second filter transistor in series. The first filter transistor and the second filter transistor prevent current flow from the gate node to the first and second power-supply inputs when the disable voltage is applied to the gate node. Thus leakage from the gate node to the first and second power-supply inputs through the first and second filter networks is blocked by the first and second filter transistor.

In still further aspects the first filter transistor is a p-channel transistor and the second filter transistor is a p-channel transistor.

DETAILED DESCRIPTION

The present invention relates to an improvement in ESD input-protection circuits. The following description is pre-sented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that active circuitry can be used to control an ESD switch that discharges current. The active circuitry can be used to disable the ESD switch during normal operation, when the power supplies are powered up, but to enable the ESD protection circuit when the power supplies are powered down.

The inventor has further realized that a thin-oxide transistor provides the best protection for other thin-oxide transistors on the chip. Thus the ESD switch is constructed from a standard thin-oxide transistor rather than a thick field-oxide transistor. The transistor characteristics of the thin-oxide ESD switch then better match the transistors being protected.

Figure 1A:
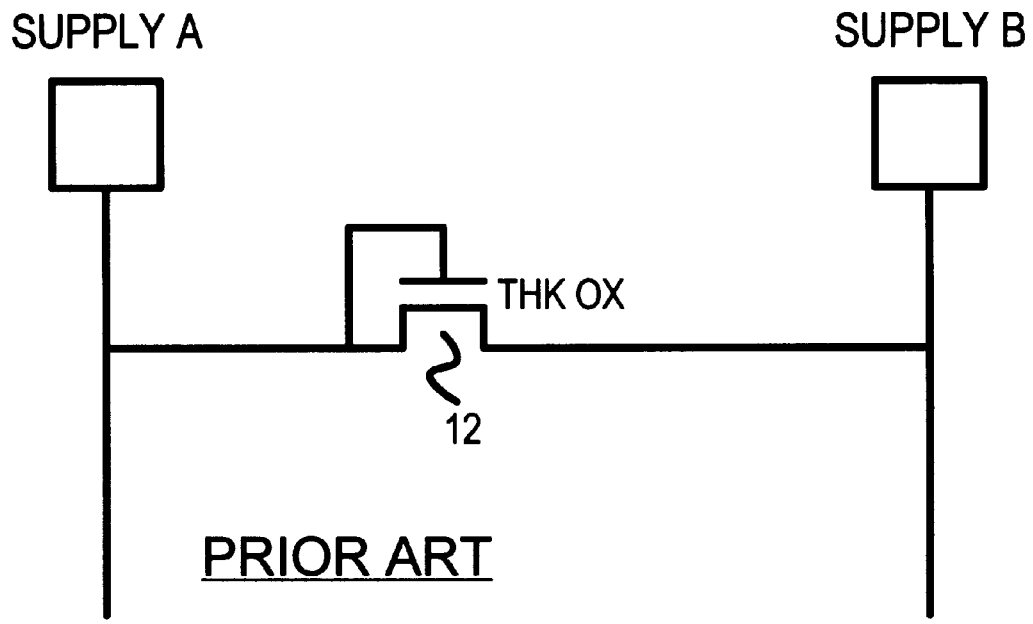
FIG. 1A shows a simplified prior-art ESD protection device using a thick-oxide transistor.
Figure 1B:
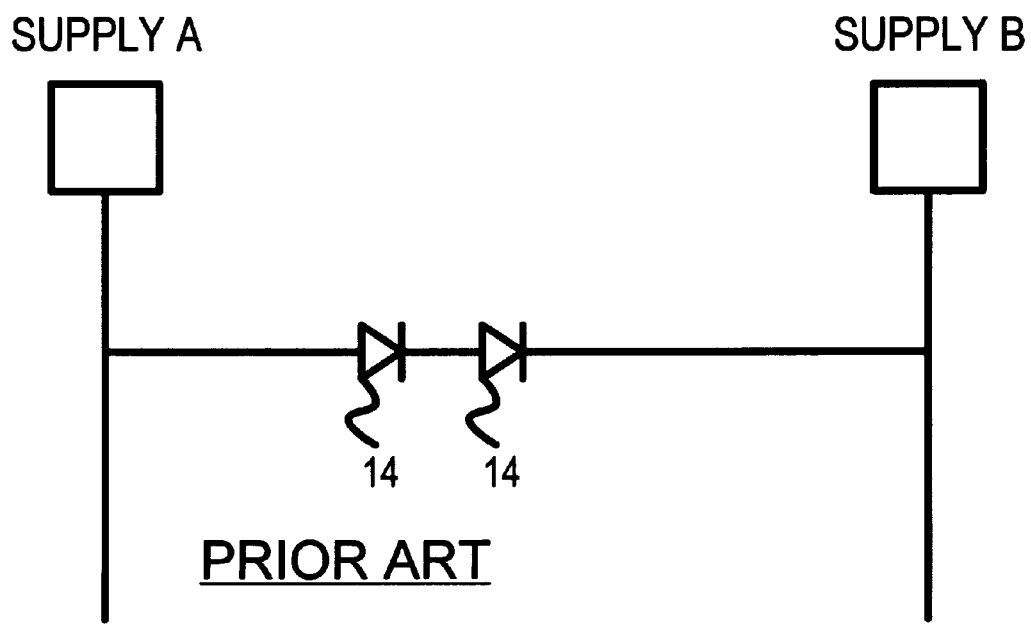
FIG. 1B shows a simplified prior-art ESD protection circuit that uses diodes.
Figure 2:
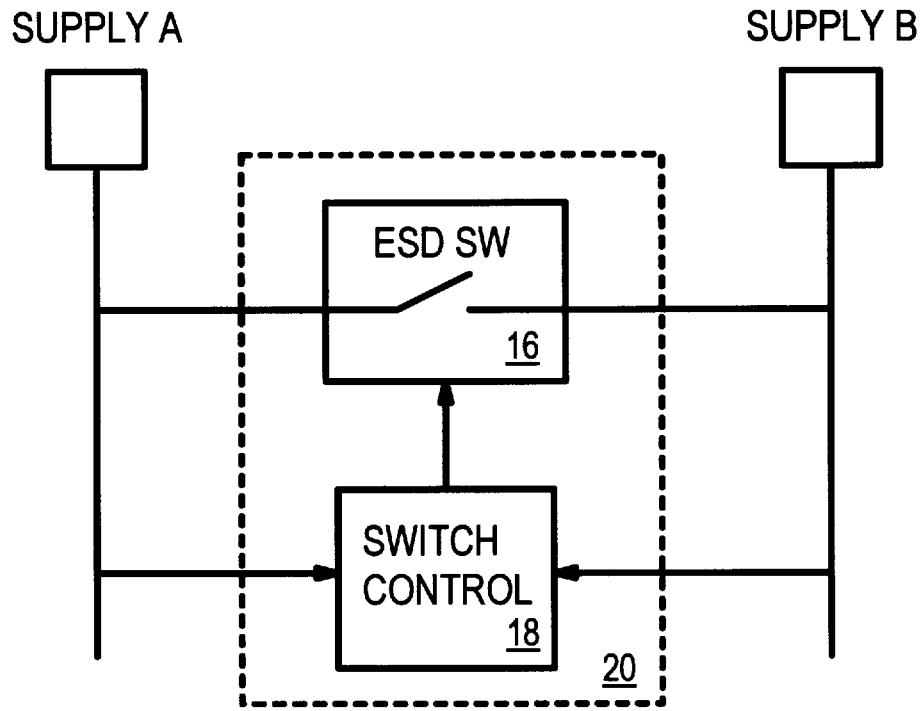
FIG. 2 highlights an actively-controlled ESD protection switch.

FIG. 2 highlights an actively-controlled ESD protection switch. ESD switch 16 discharges an ESD pulse applied between supplies A and B. ESD switch 16 includes a standard thin-oxide transistor that is enabled when the power supplies are powered down and an ESD pulse is detected.

Switch control 18 is coupled to both supplies A and B. When either supply is powered up, switch control 18 disables ESD switch 16. ESD events typically do not occur when the IC chip is inserted into a target system and powered up. ESD events occur during specialized ESD testing and during handling (movement) of the IC chip. Thus ESD switch 16 is actively disabled when the chip is powered up.

Together, ESD switch 16 and switch control 18 form ESD protection circuit 20. ESD protection circuit 20 provides protection between one pair of internal supply busses.

Figure 3:
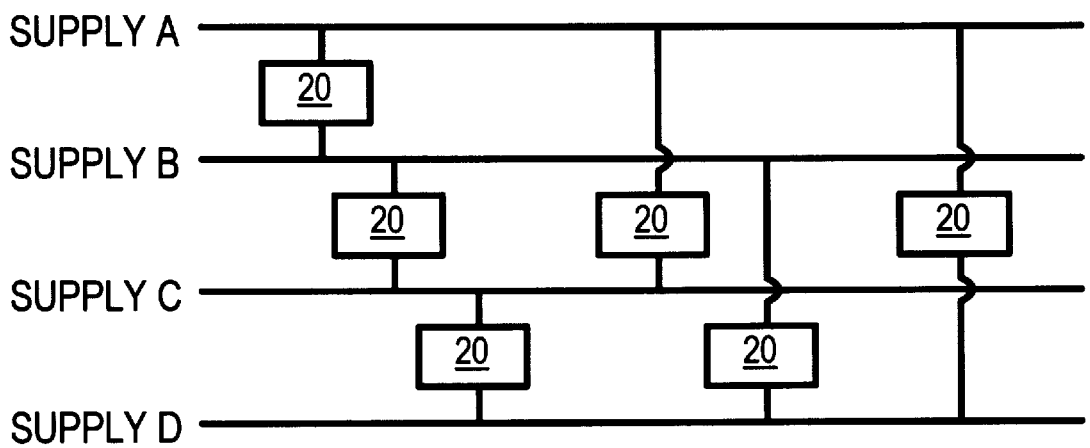
FIG. 3 shows a multiple-supply chip with multiple ESD protection circuits.

FIG. 3 shows a multiple-supply chip with multiple ESD protection circuits. Supplies A, B, C, D are internal power-supply busses that are isolated from one another. ESD protection circuits 20 each provide ESD protection between a pair of supplies. For the 4 supplies in FIG. 3, there are a total of 6 different pairings of the supplies. A total of 6 ESD protection circuits 20 are needed to provide protection between any arbitrary pair of supplies.

In general, for m internal supply busses, a total of m(m−1)/2 pairings exist, and a total of m(m−1)/2 ESD protection circuits 20 are needed. Other kinds of ESD protection circuits are used for non-supply input and output signal pins on the chip. These other ESD protection circuits (not shown) protect the signal pin to ground or one of the supplies. Protection between any arbitrary pair of pins is provided by the local ESD protection circuit on a signal pin, and by ESD protection circuits 20 that connect the various supplies together.

Figure 4:
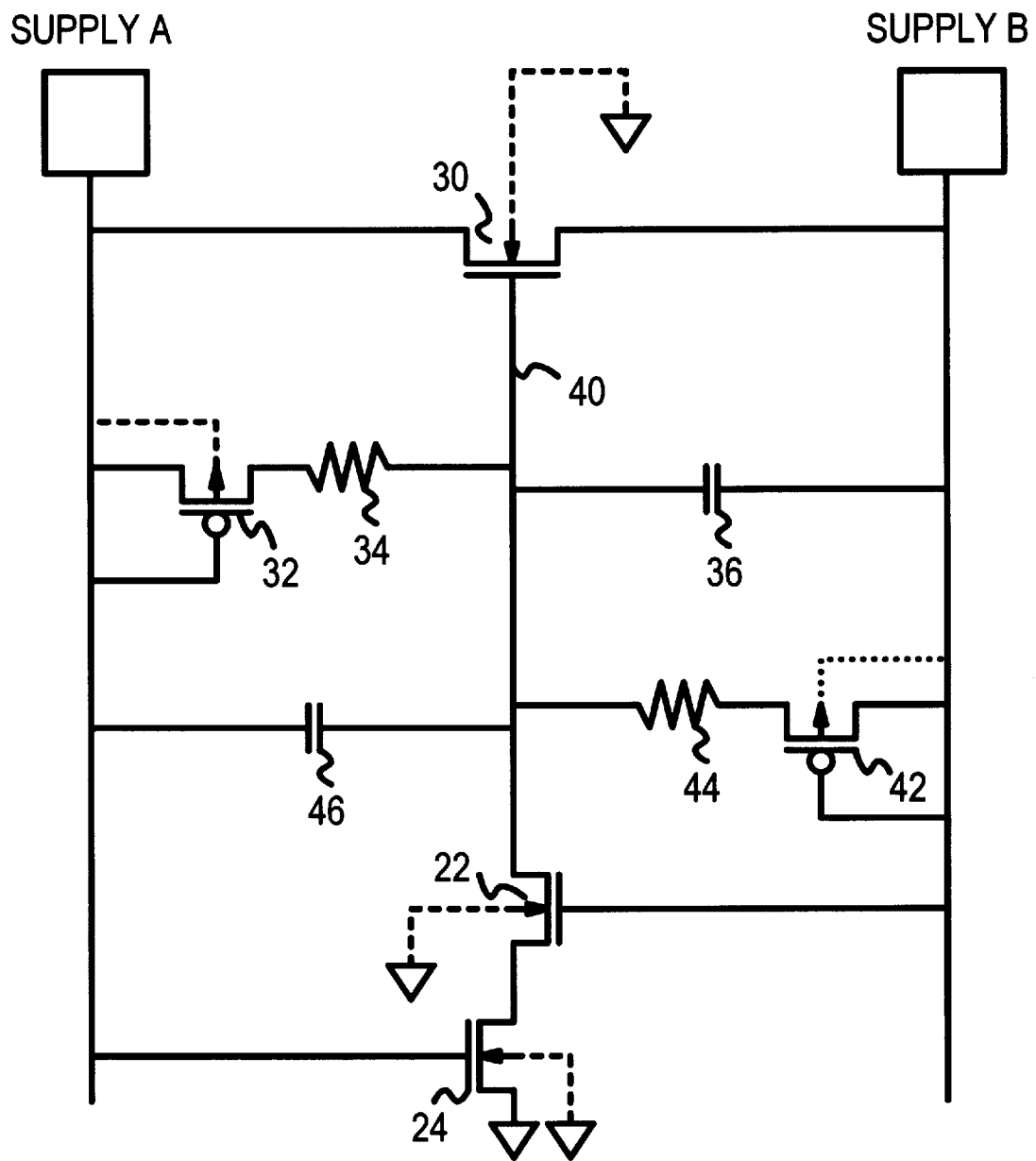
FIG. 4 is a schematic of the ESD protection circuit for internal power supply busses.

Schematic—FIG. 4

FIG. 4 is a schematic of the ESD protection circuit for internal power supply busses. ESD switch transistor 30 is a standard thin-oxide n-channel transistor. The gate oxide is several hundred angstroms in thickness, whereas field-oxide transistor have a gate oxide thickness of a micron or more. ESD switch transistor 30 is normally disabled by actively driving its gate to ground. However, during an ESD pulse on supply A or B, its gate is driven high to allow ESD switch transistor 30 to conduct, discharging the ESD pulse to the other supply.

When supply A is powered up, n-channel disable transistor 24 has its gate high and is turned on. Likewise, when supply B is powered up, n-channel disable transistor 22 has its gate high and is conducting. Gate node 40 is then discharged to ground through disable transistors 22, 24, causing the gate of ESD switch transistor 30 to be discharged to ground. Disable transistors 22, 24 thus actively turn off ESD switch transistor 30 when the power supplies are powered up.

Even when the power supplies are partially powered up, such as during system initialization, enough gate voltage is applied to disable transistors 22, 24 to discharge gate node 40. A full power-supply voltage is not necessary to actively turn off ESD switch transistor 30.

An RC network is formed by p-channel transistor 32, resistor 34, and capacitor 36.

This RC circuit couples and ESD pulse applied to supply B to gate node 40. When an ESD pulse occurs, the rapid rise in voltage on supply B is coupled through capacitor 36 to gate node 40. The voltage on gate node 40 then quickly rises. The rising voltage of gate node 40 turns on ESD switch transistor 30, since the gate-to-source voltage climbs above the transistor threshold voltage. Once ESD switch transistor 30 turns on, the ESD pulse on supply B is quickly shunted to supply A, the second pin of the pair being tested.

The voltage pulse coupled by capacitor 36 into gate node 40 is eventually discharged to supply A through resistor 34 and p-channel transistor 32. Resistor 34 is a 150-Kohm resistor while capacitor 36 is a 0.5 pico-farad capacitor in one embodiment. P-channel transistor 32 has its gate, drain, and substrate connected to supply A, while its source is connected to resistor 34. When gate node 40 rises in voltage, a negative gate-to-source voltage develops across p-channel transistor 32, turning it on. Resistor 34 and p-channel transistor 32 then discharge the voltage coupled to gate node 40 by capacitor 36. This discharge is slowed by the resistances of resistor 34 and p-channel transistor 32 so that ESD switch transistor 30 remains on sufficiently long to discharge most of the ESD pulse.

In a similar manner, capacitor 46, resistor 44, and p-channel transistor 42 act as a network for ESD pulses on supply A. A rapid voltage change in supply A is coupled by capacitor 46 to gate node 40, which enabled ESD switch transistor 30. Then gate node 40 is slowly discharged through resistor 44 and p-channel transistor 42.

The substrate of p-channel transistor 42 is connected to supply B, while the substrate of p-channel transistor 32 is connected to supply A. An N-well process can be used to isolate p-channel transistors 32, 42 in separate N-wells. N-channel transistors 30, 22, 24 have their substrates connected to ground.

Capacitors 36, 46 also provide by-pass filtering between supplies A and B during normal chip operations. This additional filtering reduces noise among the two supplies. The ESD voltage pulse applied to supplies A or B can be positive or negative. Protection is provided in the same manner for negative pulses.

ESD switch transistor 30 is preferably very large, such as 250 microns in total width (W). Other transistor can be minimum or near-minimum devices.

A thick field oxide transistor would take much more time to turn on. Thus the thin-oxide ESD switch transistor 30 turns on quickly, quickly dissipating the ESD pulse. This quick turn-on provides better ESD protection.

Figure 5:
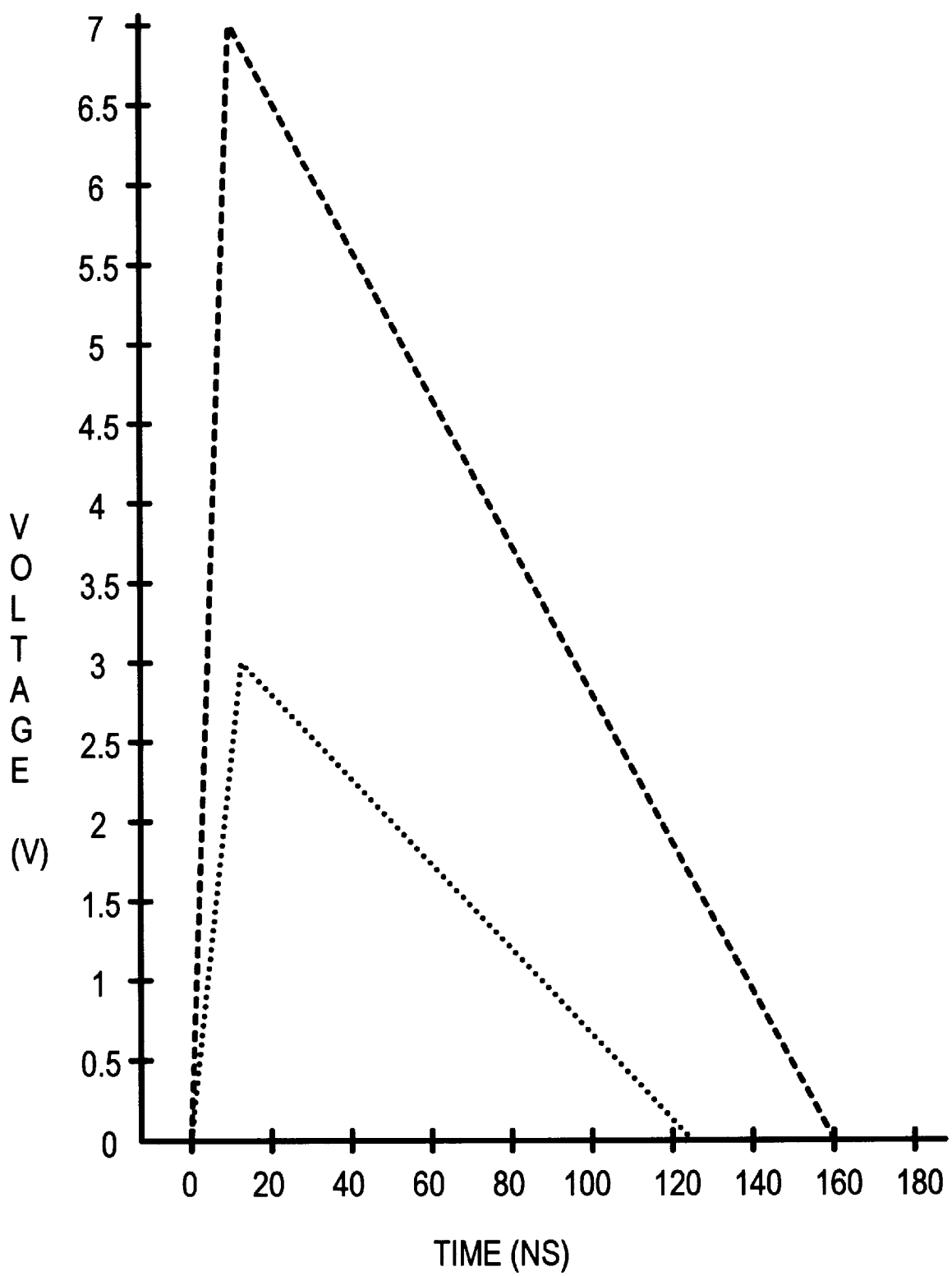
FIG. 5 is a graph of a simulated ESD pulse applied to the ESD-protection circuit of FIG. 4.

FIG. 5 is a graph of a simulated ESD pulse applied to the ESD-protection circuit of FIG. 4. An ESD pulse of 7 volts with a 10 nanosecond rise time is applied to supply A. The ESD pulse is partially coupled to gate node 40, which rises to 3 volts before the ESD switch transistor is turned on. Once the ESD switch transistor is turned on, the ESD pulse is discharged over the next 100 nanoseconds.

The quick turn on of the thin-oxide ESD switch transistor ensures that the ESD pulse is quickly discharged. This reduces the maximum voltage seen on the test pin. Damage is limited.

Advantages of the Invention

The ESD-protection circuit protects internal power supplies in a mixed-signal IC. An active protection circuit is used. The ESD-protection circuit is actively enabled and disabled by standard transistors. A thin-oxide transistor is the ESD shunt between power supply busses. This thin-oxide transistor is actively enabled and disabled. Slow and unresponsive thick-oxide transistors and diodes are avoided.

The thin-oxide transistor provides the best protection for other thin-oxide transistors on the chip. Thus the ESD switch is constructed from a standard thin-oxide transistor rather than a thick field-oxide transistor. The transistor characteristics of the thin-oxide ESD switch then better match the transistors being protected. A thick field oxide transistor would take much more time to turn on. Thus the thin-oxide ESD switch transistor turns on quickly, quickly dissipating the ESD pulse. This quick turn-on provides better ESD protection.

The capacitors also provide by-pass filtering between the supplies during normal chip operations. This additional filtering reduces noise among the two supplies. The ESD voltage pulse applied to the supplies can be positive or negative. Protection is provided in the same manner for negative pulses.

Alternate Embodiments

Several other embodiments are contemplated by the inventor. For example other transistor technologies may be substituted. Additional filtering or more complex filters may be used. Resistors and capacitors can be implemented in a variety of ways, and can be located under the bonding-pad metal to minimize area. Other combinations and arrangements of the disable transistors are possible. The Disable transistors may be arranged in parallel rather than in series to ground. Other signals may also control additional disable transistors. Power supplies of 2.5, 3.0, 3.3, 5.0 and other voltages are contemplated and may be freely used with the invention.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. An electro-static-discharge (ESD) protection circuit comprising:

a first power-supply input for coupling to a first power supply;

a second power-supply input for coupling to a second power supply, the first power supply not being directly connected to the second power supply by metal lines on an integrated circuit containing the ESD protection circuit;

an ESD switch, coupled to conduct current between the first power-supply input and the second power-supply input, the ESD switch controlled by a gate node;

an active control circuit, coupled to the first power-supply input and the second power-supply input, for driving an enable voltage onto the gate node to enable the ESD switch and for driving a disable voltage onto the gate node to disable the ESD switch;

wherein the disable voltage is driven to the gate node when the first or second power-supply inputs are powered up;

a first filter network, coupled to the first power-supply input, for coupling a rapid voltage rise from an ESD pulse applied to the first power-supply input to the gate node to generate the enable voltage on the gate node, the enable voltage causing the ESD switch to conduct the ESD pulse to the second power-supply input when the enable voltage is applied; and a first discharge path, in the first filter network, coupled between the gate node and the second power-supply input, for gradually discharging the enable voltage to the second power-supply input through a first resistor, whereby the ESD switch is actively disabled and enabled.

2. The ESD protection circuit of claim 1 wherein the ESD switch comprises a standard n-channel transistor having substantially a same thickness of gate oxide as most other n-channel transistors on the integrated circuit, whereby a standard thin-oxide n-channel transistor shunts the ESD pulse between the first and second power-supply inputs.

3. The ESD protection circuit of claim 2 wherein the active control circuit further comprises:

a first disable transistor, having a gate coupled to the first power-supply input, for discharging the gate node to a ground when the first power supply is powered up; and a second disable transistor, having a gate coupled to the second power-supply input, for discharging the gate node to the ground when the second power supply is powered up, whereby the disable voltage is driven to the gate node by the first and second disable transistors.

4. The ESD protection circuit of claim 3 wherein the first disable transistor and the second disable transistor are connected in series between the gate node and the ground.

5. The ESD protection circuit of claim 4 further comprising:

a second filter network, coupled to the second power-supply input, for coupling a rapid voltage rise from an ESD pulse applied to the second power-supply input to the gate node to generate the enable voltage on the gate node, the enable voltage causing the ESD switch to conduct the ESD pulse to the first power-supply input when the enable voltage is applied; and a second discharge path, in the second filter network, coupled between the gate node and the first power-supply input, for gradually discharging the enable voltage to the first power-supply input through a second resistor, whereby the first and second filter networks provide symmetric protection for both the first and second power-supply inputs.

6. The ESD protection circuit of claim 5 wherein the first filter network includes a first capacitor between the first power-supply input and the gate node for capacitively coupling the rapid voltage rise from an ESD pulse to the gate node;

wherein the second filter network includes a second capacitor between the second power-supply input and the gate node for capacitively coupling the rapid voltage rise from an ESD pulse to the gate node.

7. The ESD protection circuit of claim 6 wherein the first capacitor and the second capacitor comprise a bypass means for providing bypass capacitate filtering between the first power supply and the second power supply when powered up wherein power-supply noise is reduced.

8. The ESD protection circuit of claim 6 wherein the first discharge path includes the first resistor and a first filter transistor in series; and the second discharge path includes the second resistor and a second filter transistor in series;

wherein the first filter transistor and the second filter transistor prevent current flow from the gate node to the first and second power-supply inputs when the disable voltage is applied to the gate node, whereby leakage from the gate node to the first and second power-supply inputs through the first and second filter networks is blocked by the first and second filter transistor.

9. The ESD protection circuit of claim 8 wherein the first filter transistor is a p-channel transistor and the second filter transistor is a p-channel transistor.

10. The ESD protection circuit of claim 9 wherein the first filter transistor has a gate and a drain coupled to the second power-supply input and the second filter transistor has a gate and a drain coupled to the first power-supply input.

11. The ESD protection circuit of claim 10 wherein the first filter transistor is formed in a separate N-well and has a substrate electrically connected to the second power-supply input but not connected to the first power-supply input;

wherein the second filter transistor is formed in a separate N-well and has a substrate electrically connected to the first power-supply input but not connected to the second power-supply input, whereby the first and second filter transistors are formed in separate N-wells for isolation.

12. The ESD protection circuit of claim 11 wherein the enable voltage is any voltage above a threshold voltage of a standard n-channel transistor and wherein the disable voltage is below the threshold voltage.

13. A mixed-signal chip comprising:

multiple internal power-supply busses for providing separate power to different portions of the mixed-signal chip;

a plurality of electro-static-discharge (ESD) protection circuits, wherein each ESD protection circuit is coupled between two of the multiple internal power-supply busses;

each ESD protection circuit comprising:

a n-channel transistor, with a source coupled to a first power supply and a drain coupled to a second power supply, and a gate coupled to a gate node;

a first disable transistor, having a gate coupled to the first power supply;

a second disable transistor, having a gate coupled to the second power supply;

the first and second disable transistor for connecting the gate node to ground when the first and second power supplies are powered up;

a first capacitor, coupled between the first power supply and the gate node, for coupling an ESD pulse applied to the first power supply to the gate node;

a second capacitor, coupled between the second power supply and the gate node, for coupling an ESD pulse applied to the second power supply to the gate node, a first discharge path, coupled between the gate node and the second power supply, having a first resistor in series with a first filter transistor, the first filter transistor conducting current only when an ESD pulse is received by the first power supply; and a second discharge path, coupled between the gate node and the first power supply, having a second resistor in series with a second filter transistor, the second filter transistor conducting current only when an ESD pulse is received by the second power supply, whereby the ESD protection circuits use the n-channel transistor to discharge ESD pulses applied to the power supplies of the multiple internal power-supply busses.

14. The mixed-signal chip of claim 13 wherein the first and second disable transistors are n-channel transistors having a substrate connected to ground.

15. The mixed-signal chip of claim 14 wherein the n-channel transistor has a thin gate oxide with substantially a same thickness as a majority of other n-channel transistors on the mixed-signal chip, wherein the same thickness is substantially less than a field-oxide thickness of oxide between adjacent transistors.

16. The mixed-signal chip of claim 15 wherein the first capacitor raises a voltage of the gate node above a threshold voltage of the n-channel transistor to enable the n-channel transistor when an ESD pulse is applied to the first power supply;

wherein the second capacitor raises a voltage of the gate node above a threshold voltage of the n-channel transistor to enable the n-channel transistor when an ESD pulse is applied to the second power supply.

17. The mixed-signal chip of claim 16 wherein the multiple internal power-supply busses comprise m power supplies, where m is a whole number, wherein a number of the ESD protection circuits is m(m−1)/2 to protect all of the multiple internal power-supply busses.

18. An electro-static-discharge (ESD) protection device comprising:

a first power-supply input means for coupling to a first power supply;

a second power-supply input means for coupling to a second power supply, the first power supply not being directly connected to the second power supply by metal lines on an integrated circuit chip containing the ESD protection device;

ESD switch means, coupled to conduct current between the first power-supply input means and the second power-supply input means, the ESD switch means controlled by a gate node means;

active control means, coupled to the first power-supply input means and the second power-supply input means, for driving an enable voltage onto the gate node means to enable the ESD switch means and for driving a disable voltage onto the gate node means to disable the ESD switch means;

wherein the disable voltage is driven to the gate node means when the first or second power-supply input means are powered up;

first filter means, coupled to the first power-supply input means, for coupling a rapid voltage rise from an ESD pulse applied to the first power-supply input means to the gate node means to generate the enable voltage on the gate node means, the enable voltage causing the ESD switch means to conduct the ESD pulse to the second power-supply input means when the enable voltage is applied; and first discharge means, coupled between the gate node means and the second power-supply input means, for gradually discharging the enable voltage to the second power-supply input means through a first resistor means, whereby the ESD switch means is actively disabled and enabled.

19. The ESD protection device of claim 18 wherein the ESD switch means comprises a standard n-channel transistor having substantially a same thickness of gate oxide as most other n-channel transistors on the integrated circuit, whereby a standard thin-oxide n-channel transistor shunts the ESD pulse between the first and second power-supply input means.

20. The ESD protection device of claim 19 wherein the active control means further comprises:

a first disable transistor, having a gate coupled to the first power-supply input means, for discharging the gate node means to a ground when the first power supply is powered up; and a second disable transistor, having a gate coupled to the second power-supply input means, for discharging the gate node means to the ground when the second power supply is powered up, whereby the disable voltage is driven to the gate node means by the first and second disable transistors.

* * * * *